United States Patent
Muljono

(10) Patent No.: US 7,363,551 B2
(45) Date of Patent: Apr. 22, 2008

(54) SYSTEMS AND METHODS FOR MEASURING SIGNAL PROPAGATION DELAY BETWEEN CIRCUITS

(75) Inventor: Harry Muljono, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 11/323,695

(22) Filed: Dec. 30, 2005

(65) Prior Publication Data

US 2007/0164728 A1 Jul. 19, 2007

(51) Int. Cl.
G11B 20/20 (2006.01)
G06K 5/04 (2006.01)

(52) U.S. Cl. ....................................... 714/700
(58) Field of Classification Search .................. 714/700
See application file for complete search history.

(56) References Cited

U.S. PATENT DOCUMENTS 5,815,655 A * 9/1998 Koshiyama .................. 714/45
7,065,683 B1 * 6/2006 Sluiter et al. ................ 714/700
7,065,684 B1 * 6/2006 Chan .......................... 714/700

\* cited by examiner

*Primary Examiner*—James C. Kerveros
(74) *Attorney, Agent, or Firm*—Schubert Osterrieder & Nickelson PLLC; Patrick S. Stellitano

(57) ABSTRACT

Embodiments include systems and methods for measurement of signal propagation delay between Input/Output (IO) Loopback (IOLB) circuits. Embodiments include measurement of an output delay time of a first IOLB circuit and measurement of an input delay time of a second IOLB circuit. Embodiments also include measurement of a total delay time from an internal point of the first IOLB circuit to an internal point of the second IOLB circuit. Embodiments subtract from the measured total delay time, the measured output delay time of the first IOLB circuit and the measured input delay time of the second IOLB circuit to determine the time of flight of a signal between the I/O pads of the two IOLB circuits.

12 Claims, 8 Drawing Sheets

SYSTEMS AND METHODS FOR MEASURING SIGNAL PROPAGATION DELAY BETWEEN CIRCUITS

FIELD

The present invention is in the field of electrical circuitry characterization. More particularly, the invention is in the field of measurement of signal propagation delay between circuits.

BACKGROUND

Signal propagation delay is a major component of a system timing equation. For common clock signals, propagation delay directly determines a maximum operating frequency, whereas the delay between the data and a strobe is critical for Source Synchronous (SS) signals. The propagation delay depends on board parameters such as the dielectric constant of mother board materials, line thickness, and the distance to neighboring conducting lines. These variables vary from one board to another as a result of non-zero manufacturing tolerances. Characterizing the delay is important to understand the system margin. Thus, one finds it necessary to develop a simple and reliable non-intrusive method to determine signal propagation delay between circuits.

One method for determining signal propagation delay involves using an oscilloscope and two probes to measure the amount of delay. The amount of delay is read from the oscilloscope display. This method is manual, tedious and labor intensive and slow. In addition, the method can be used only to the extent that the points to be probed are exposed on the board. Also, probe tip capacitance can load a lightly loaded circuit and alter the signal timing.

Another method involves a counter and a filter. The filter extracts a high frequency component of the signal to be measured. The extracted high frequency component charges a capacitor. A comparator compares the level of charge on the capacitor to a reference level. A signal from the comparator when the reference level is exceeded causes a counter to stop counting. The count of the counter, when counting stops, is proportional to signal propagation delay. This method is impractical in general since the method requires a filter and counter to be built into the receiving circuitry of each of the circuits between which the signal travels. Also, for accuracy, the capacitor and filter components must be compensated for voltage and temperature changes.

BRIEF DESCRIPTION OF THE DRAWINGS

Advantages of the invention will become apparent upon reading the following detailed description and upon reference to the accompanying drawings in which like references may indicate similar elements.

DETAILED DESCRIPTION OF EMBODIMENTS

The following is a detailed description of embodiments of the invention depicted in the accompanying drawings. The embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Embodiments include systems and methods for measurement of signal propagation delay between Input/Output (IO) Loopback (IOLB) circuits. Embodiments include measurement of an output delay time of a first IOLB circuit and measurement of an input delay time of a second IOLB circuit. Embodiments also include measurement of a total delay time from an internal point of the first IOLB circuit to an internal point of the second IOLB circuit. Embodiments subtract from the measured total delay time, the measured output delay time of the first IOLB circuit and the measured input delay time of the second IOLB circuit to determine the time of flight of a signal between the I/O pads of the two IOLB circuits.

Figure 1:
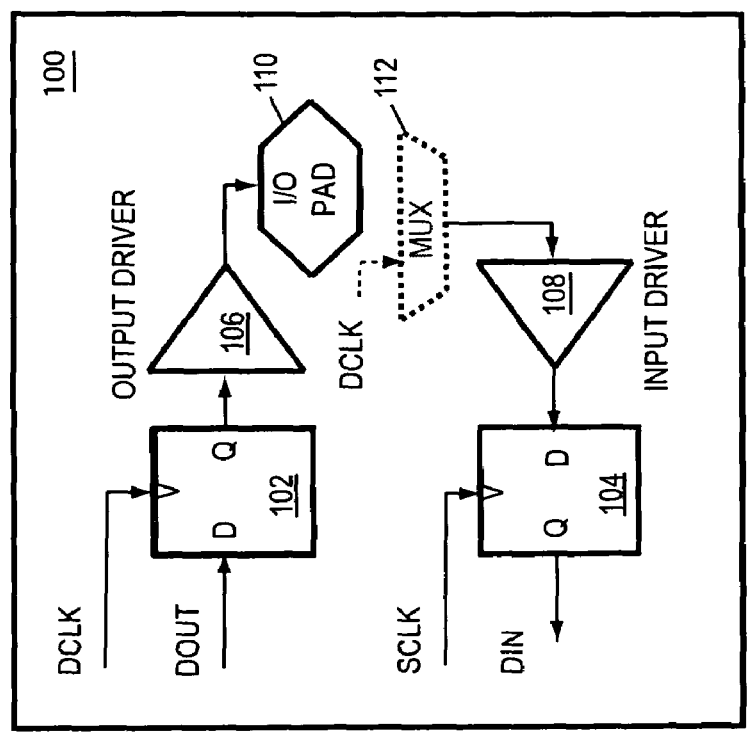
FIG. 1 depicts a simplified drawing of an Input/Output (IO) Loopback (IOLB) circuit with an additional multiplexer.

FIG. 1 shows a simplified diagram of an embodiment of an Input/Output (IO) Loopback (IOLB) circuit 100. IOLB circuit 100 may be conventional except as modified by introducing a 2-to-1 multiplexer 112 fed at one input by the data clock "dclk" and at the other input by the signal on the Input/Output (I/O) pad 110. IOLB circuit 100 comprises an output circuit and an input circuit. The output circuit comprises a D type register 102 and an output driver 106. D-type register 102 receives data that is destined to be output at I/O pad 110. Register 102 is clocked by the data clock, dclk. When the data clock, dclk, transitions, the data the register receives, dout, is latched or set up at the output of register 102.

Output driver 106 receives the output data from register 102 and transmits the data to I/O pad 110. Output driver 106 may amplify the received data signal and also serves to ensure the correct output impedance as seen from I/O pad 110. I/O pad 110 receives the data signal from output driver 106. I/O pad 110 is connected to an output line (not shown) that conducts the output data signal to other circuits. The connection may be one-to-one or one-to-many. Thus, output data is passed to register 102, clocked to its output, and passed by output driver 106 to the I/O pad 110.

The input circuit of IOLB circuit 100 comprises a multiplexer 112, an input driver 108 and a register 104. I/O pad 110 may receive an input data signal from a conducting line connected thereto. A conducting line connected to I/O pad 110 may be one of a plurality of data bus lines. Therefore, the input data signal may be from one of a plurality of circuits in a system of circuits. For example, a plurality of integrated circuits, each on a separate die, may be in a digital system such as a computer. Such integrated circuits may comprise a micro processor, Random Access Memory (RAM) chips, Read Only Memory (ROM) chips, a bus controller chip, etc. A chip may typically have a plurality of IOLB circuits 100, one associated with each I/O pad.

In the alternative to receiving a signal from a conducting line connected to the I/O pad, I/O pad 110 may receive, instead, the signal placed on I/O pad 110 by output driver 106. Thus, in a normal operating mode, I/O pad 110 receives a signal from the conducting line connected thereto. In a test mode, I/O pad 110 receives a test signal from output driver 106. This test signal is generated by a pattern generator internal to the IOLB circuit and delivered to a comparator internal to the IOLB circuit.

Multiplexer 112 receives at one of its inputs the input data signal from I/O pad 110. Multiplexer 112 receives at another of its inputs the data clock, dclk. Multiplexer 112 functions as a switch between the inputs and the outputs. Thus, at one time the multiplexer may connect the data clock to the output of the multiplexer, while at another time the multiplexer may connect data received from the I/O pad to the output of the multiplexer. The function the IOLB circuit is called upon to perform dictates which input of multiplexer 112 is connected to its output. Thus, in a normal input mode, multiplexer 112 passes data received from the I/O pad to an input driver 108. In one test step, the multiplexer passes a test signal received from the I/O pad to the input driver 108. In another test step, the multiplexer passes dclk to input driver 108.

Input driver 108 receives the signal output from multiplexer 112 and amplifies the signal. Input driver 108 then passes the amplified signal to the input of a D type register 104. Register 104 receives the signal from input driver 108 and latches the signal to its output in response to a strobe clock, "sclk" to produce the data signal din.

As noted, an I/O pad 110 receives or transmits a signal on a conducting line connected thereto. The conducting line may be a bus line that connects the I/O pad to the I/O pads of one or more other chips in the system. In some instances a conducting line may connect two I/O pads on the same chip. As a signal propagates on a conducting line from one I/O pad to another, the signal undergoes delay. This delay depends upon such factors as the line length, the line width, the separation between lines, and the effective dielectric constant of the board carrying the line. Analytical methods of predicting delay exist, but provide only an approximation which is typically not equal to the actual delay of the signal on the line. Therefore, measurement of the delay of a signal on a line is needed. Moreover, a desirable measurement method is electronic, very accurate, easily implemented, repeatable, and non-intrusive.

Figure 2:
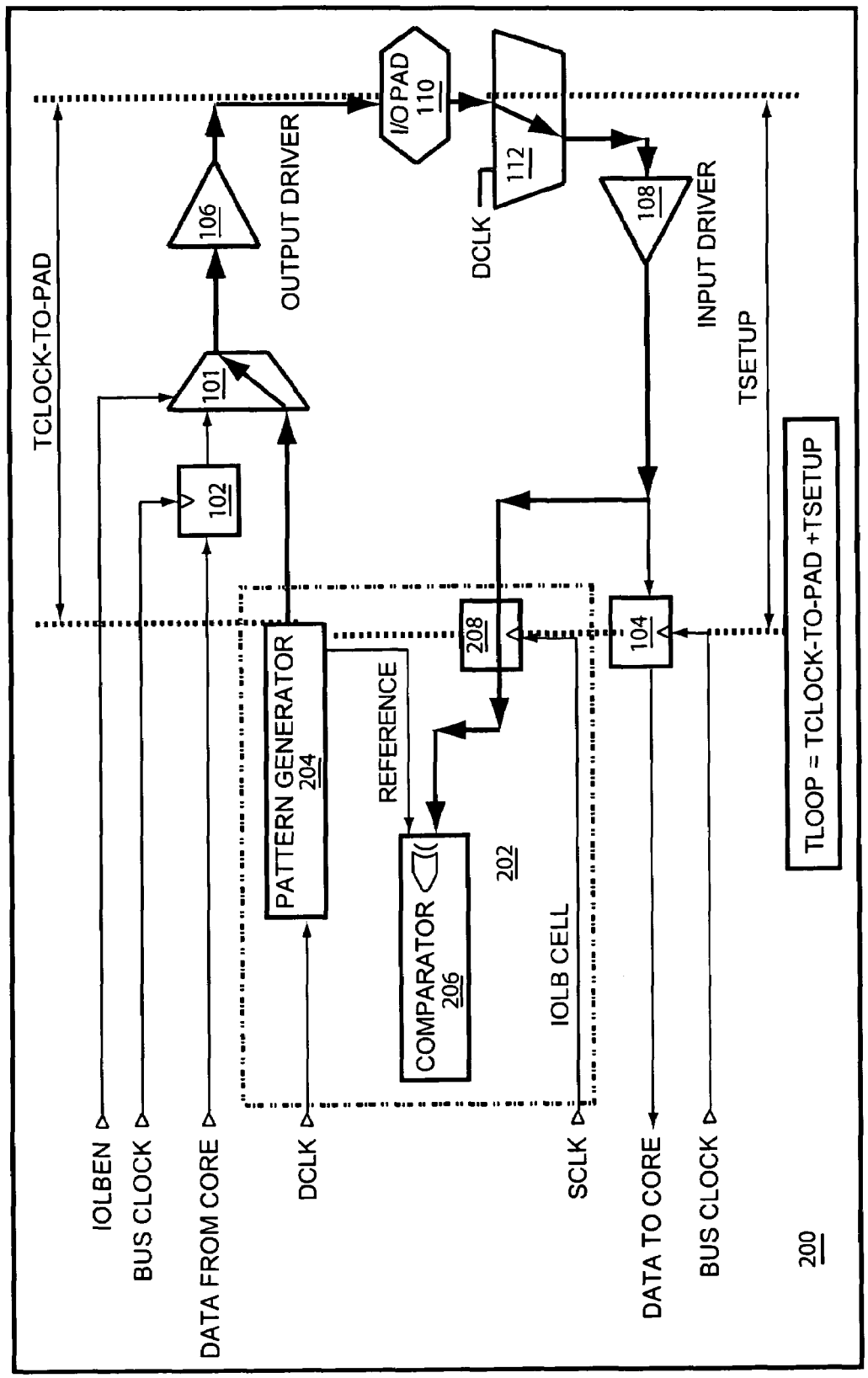
FIG. 2 depicts a more detailed view of an IOLB circuit for measuring Tloop.

FIG. 2 shows in more detail an embodiment of an IOLB circuit 200 for an I/O pad 110. I/O circuit 200 is integrated into a core circuit that receives, processes, and transmits data. The core circuit may be a microprocessor, a bus controller, a memory controller, etc. Register 102 receives data from the core. Register 102 latches this data to its output in response to a bus clock. A first multiplexer 101 receives the data from register 102 at one of its inputs. Multiplexer 101 receives at another of its inputs a signal from a pattern generator 204 of an Pattern generator 204 produces a patterned sequence of data for test purposes. For example, a sequence from pattern generator 204 is used to test the electrical integrity of bus lines. Also, a sequence from pattern generator is used for measurement of the delay of circuitry internal to the IOLB circuit, in order to determine a time of propagation of a signal on a conducting line between IOLB circuits.

A signal labeled IOLbEn controls multiplexer 101. When IOLbEn is one value, multiplexer 101 connects the signal received from register 102 to its output. When IOLbEn is an opposite value, multiplexer 101 connects the signal from pattern generator 204 to its output. Thus, in a normal mode of operation IOLB circuit 200 transfers data from the core circuit to be output at its I/O pad 110. In a first test configuration, IOLB circuit 200 transfers a patterned sequence from the pattern generator to be output at its I/O pad 110. In a second test configuration, IOLB circuit transfers data from the pattern generator internally to the comparator through multiplexer 112.

Thus, with IOLbEn enabled, the signal from pattern generator 204, passes through multiplexer 101, to output driver 106. The signal then passes to I/O pad 110. In a test of the electrical integrity of lines connected to I/O pad 110, the signal pattern from pattern generator 204 is placed on conducting lines by way of I/O pad 110. A receiving IOLB circuit receives this signal pattern and passes it to its own internal comparator to compare it to the pattern generated by its own internal pattern generator. If the patterns match, then the connecting conducting line exhibits electrical integrity.

In a test mode of operation, the signal pattern from pattern generator 204 is brought through multiplexer 101, through output driver 106, through I/O pad 110, onward through multiplexer 112, through input driver 108 to a register 208 to comparator 206. The time that it takes for the signal to travel from pattern generator 204 to comparator 206 through this path is denoted Tloop. The path corresponding to Tloop comprises two sequential paths. The first of the sequential paths is from pattern generator 204 to I/O pad 110. This is the internal output delay time. The time it takes for a signal to travel this path is denoted Tclock-to-pad, or Tco. The second of the sequential paths is from I/O pad 110 to multiplexer 112 to comparator 206. This is the internal input delay time. The time it takes for a signal to travel this path is denoted Tsetup, or Tsu. Thus, we have the equation:

$$Tloop=Tco+Tsu.$$

As will be presently shown, we can measure Tloop and Tsu. This enables us to determine Tco=Tloop−Tsu. Knowledge of Tsu and Tco enables us to determine the time of flight of a signal from on IOLB circuit to another IOLB circuit. The determined time of flight is the propagation delay of the signal between IOLB I/O pads.

Thus, we first measure Tloop and Tsu and from these we calculate Tco. We can do this for each circuit and store the results in memory. To measure Tloop we select the path from pattern generator 204 through multiplexer 101 and from I/O pad 110 through multiplexer 112. FIG. 2 emphasizes this path by dark arrows. The signal traveling this first path undergoes a delay equal to Tloop. To measure the delay we compare the signal that travels the first path to a reference signal from pattern generator 204. Comparator 206 thus forms a comparison between the reference signal and the signal from the first path to determine the delay time, Tloop. Thus, delay along the first path is electronically measured.

Figure 3:
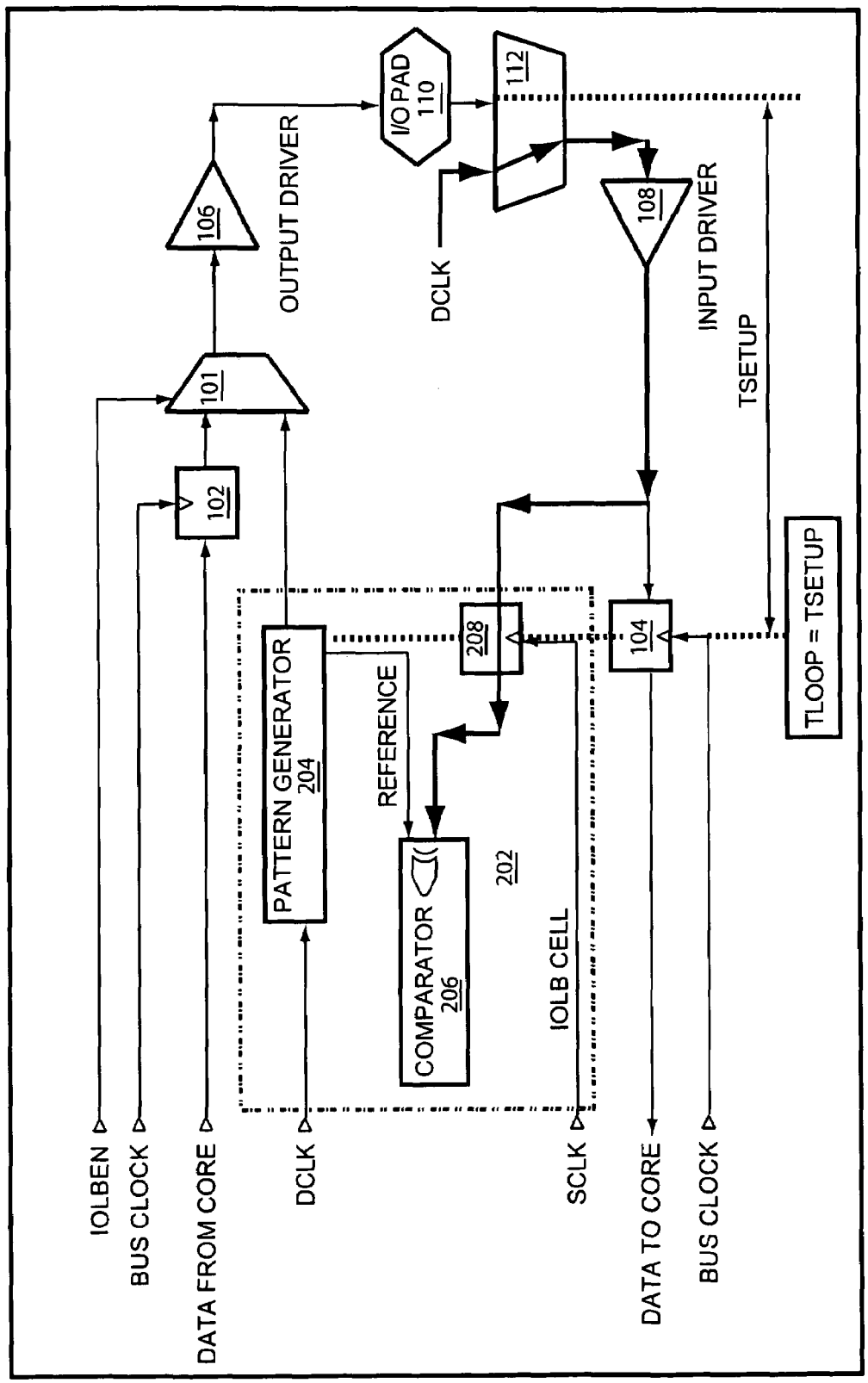
FIG. 3 depicts an IOLB circuit for measuring Tsu

To measure Tsu (Tsetup) we select a second path from the DCLK input of multiplexer 112 to comparator 206. FIG. 3 emphasizes this path by dark arrows. FIG. 3 is otherwise identical to FIG. 2. The signal, DCLK, traveling this second path undergoes a delay equal to Tsu. To measure this delay we compare the signal that travels the second path to the reference signal from pattern generator 204. The reference signal from pattern generator 204 is, for this measurement, equal to DCLK. Comparator 206 thus forms a comparison between the reference signal, DCLK, and the delayed DCLK signal that travels the second path to determine the delay time, Tsu. Thus, the delay along the second path is electronically measured. Once Tsu is known, Tco can be computed. (Tco=Tloop−Tsu.) The significance of these measurements to determine the signal delay when a signal travels along a conducting line between the I/O pads of two circuits will be explained with reference to FIGS. 4 and 5.

Thus, embodiments include an IOLB circuit with an I/O pad, comprising an output path from a first internal point of the IOLB circuit to the I/O pad of the IOLB circuit. The through the output path to the I/O pad of the IOLB circuit. A multiplexer in an input path selects as an output one of a plurality of inputs, one input receiving a signal from the I/O pad of the input of the multiplexer to a second internal point of the IOLB circuit. A comparator receives at a first of its inputs one of the first and second test signals and receives at a second of its inputs a reference signal from the pattern generator. The comparator determines a first propagation time of the first test signal along the output path and the input path, and determines a second propagation time of the second test signal along the input path. A calculator subtracts the second propagation time from the first propagation time to determine a third propagation time of a signal along the output path.

The calculator also determines a time of flight from the I/O pad of a first IOLB circuit to the I/O pad of a second IOLB circuit by first measuring a total delay time from the first internal point of the first IOLB circuit to a second internal point of the second IOLB circuit. The calculator subtracts from this measurement the propagation time of the signal along the output path of the first IOLB circuit and the propagation time of the signal along the input path of the second IOLB circuit.

Figure 4:
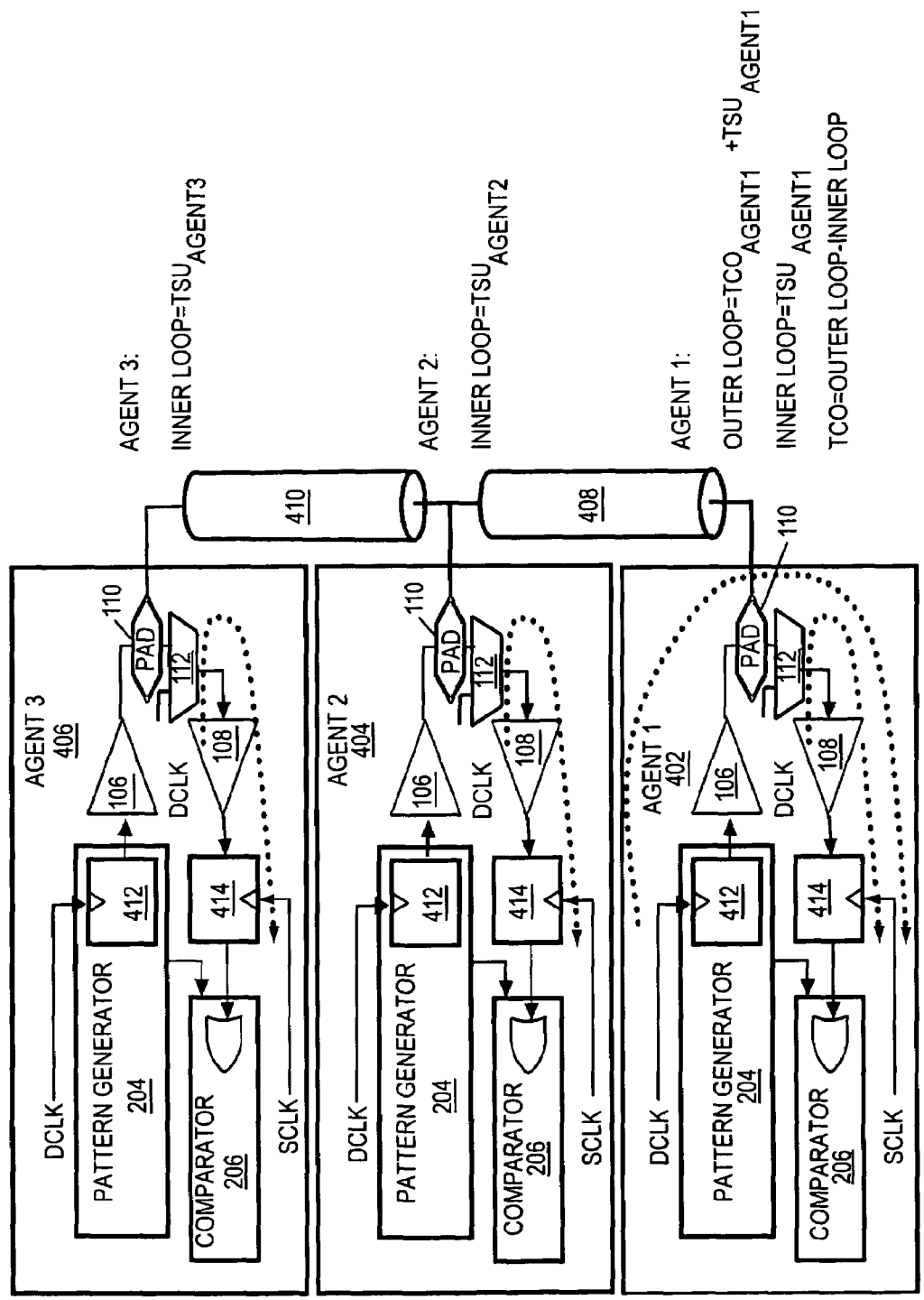
FIG. 4 depicts a configuration for determining internal delay times of a plurality of IOLB circuits.
Figure 5:
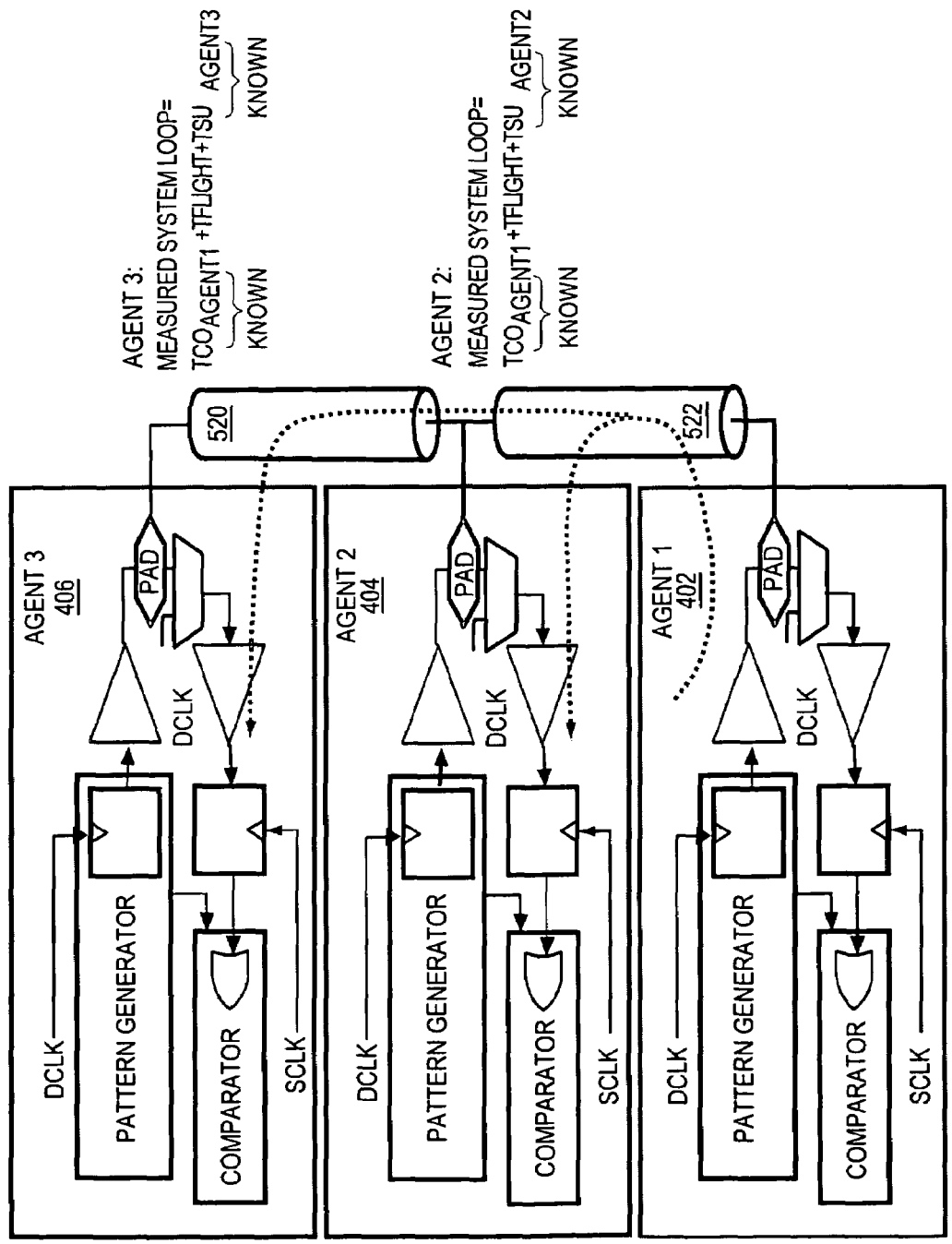
FIG. 5 depicts a configuration for determining a time of flight between two IOLB circuits.

FIG. 4 shows three agents 402, 404, and 406 connected by conducting lines 408 and 410. Each agent is an IOLB circuit such as described above with reference to FIGS. 2 and 3. For clarity, not all of the IOLB components are shown in FIGS. 4 and 5. Each agent may be on the same circuit board as other agents or on a different circuit board. Also, each agent may be on the same chip as other agents or on a different chip. The conducting lines 408 and 410 may be a combination of conducting strips in or on the board and/or cables. Thus, the path from agent 1 (402) to agent 2 (404) may comprise a conducting strip and may comprise a cable, such as a coaxial cable or even an optical fiber. The same is true for the path from agent 2 (404) to agent 3 (406) and from agent 1 to agent 3.

Since each agent is an IOLB circuit as described above, we can determine the values of Tco and Tsu for each agent following the procedures just described. Now, suppose we want to measure the time of flight of a signal transmitted from agent 1 to agents 2 and 3. That is, we are interested in how long it takes a signal to travel from the I/O pad of agent 1 to the I/O pads of agents 2 and 3. In preparation for making this determination we first determine Tco for agent 1 and Tsu for agents 2 and 3. The paths to be computed are shown as a dashed arrow in FIG. 4. In the driver circuit, agent 1, we see an inner loop and an outer loop. The outer loop is the path from a register 412 of pattern generator 204 through the driver 106 through pad 110, through multiplexer 112, through driver 108, through a register 414 to comparator 206. The inner loop is the path from the DCLK signal input to multiplexer 112, through input driver 108, through register 414, to comparator 206. Note that the register 412 of pattern generator 204 is clocked by DCLK, whereas the register 414 is clocked by SCLK.

Thus, in preparation for determining time of flight along conducting lines, we determine Tsu for agent 2 and 3, and we determine Tco for agent 1. FIG. 5 shows the paths to be computed as dashed arrows. Path 520 is from the pattern generator of the first agent 402 to the comparator of the second agent 404. The time for the signal from the pattern generator of the first agent to reach the comparator of the second agent is:

$$T_{total}=Tco_{agent\ 1}+T_{flight}+Tsu_{agent2}$$

$T_{total}$ is measured. $T_{flight}$ is the time it takes the signal to travel from the I/O pad of agent 1 to the I/O pad of agent 2. Since $Tco_{agent\ 1}$ and $Tsu_{agent\ 2}$ are known, $T_{flight}$ can be computed directly.

Path 522 is from the pattern generator of the first agent 402 to the comparator of the third agent 406. The time for the signal from the pattern generator of the first agent to reach the comparator of the third agent is $$T_{total}=Tco_{agent\ 1}+T_{flight}+Tsu_{agent3}$$

$T_{flight}$ is the time it takes the signal to travel from the I/O pad of agent 1 to the I/O pad of agent 3. Since $Tco_{agent\ 1}$ and $Tsu_{agent3}$ are known, $T_{flight}$ can be computed directly.

Thus, the embodiments provide a way of accurately measuring the propagation time of a signal on a conducting line connecting the I/O pads of two IOLB circuits. Associated with each I/O pad is a circuit comprising a pattern generator and a comparator. An internal output delay time is the time for the signal to travel from a first point internal to the first IOLB circuit to the I/O pad of the first IOLB circuit. An internal input delay time is the time for the signal to travel from the I/O pad of the second IOLB circuit to a second point internal to the second IOLB circuit. One first determines the internal output delay of the first IOLB circuit and internal input delay of the second IOLB circuit. One then measures the total time delay from the first point to the second point. One subtracts from this measurement the internal output time delay and the internal input time delay. This yields the time for the signal to propagate from the Following the procedure described above, one may determine the time of flight between any two connected IOLB circuits in an entire complex system such as a computer or server. Thus, in general terms $$T_{flight\_mn}=T_{total\_mn}-Tco_{agent\_m}-Tsu_{agent\_n}$$

This equation yields $T_{flight\_mn}$ which is the time of flight of the signal from the I/O pad of agent_m to the I/O pad of agent_n. $Tco_{agent\_m}$ is the internal output delay time of agent_m, and $Tsu_{agent\_n}$ is the internal input delay time of agent_n.

Thus, embodiments include a test system for measuring times of flight between delay time and an output delay time. A controller selects two IOLB circuits and determines a time of flight there between by measuring a total delay time and subtracting both an output delay time of a first of the two IOLB circuits and an input delay time of the second IOLB circuit. The system may further comprise a multiplexer controller to set up for each of one or more IOLB circuits, a first test path comprising both an output path and an input path, and a second test path comprising the input path. An IOLB circuit comprises a multiplexer to receive at one input a signal from the I/O pad of the IOLB circuit and to receive at another input a test signal. The from a data source. The test system further comprises a calculator to subtract a measured signal propagation time along the second test path from a measured signal propagation time along the first test path.

Figure 5A:
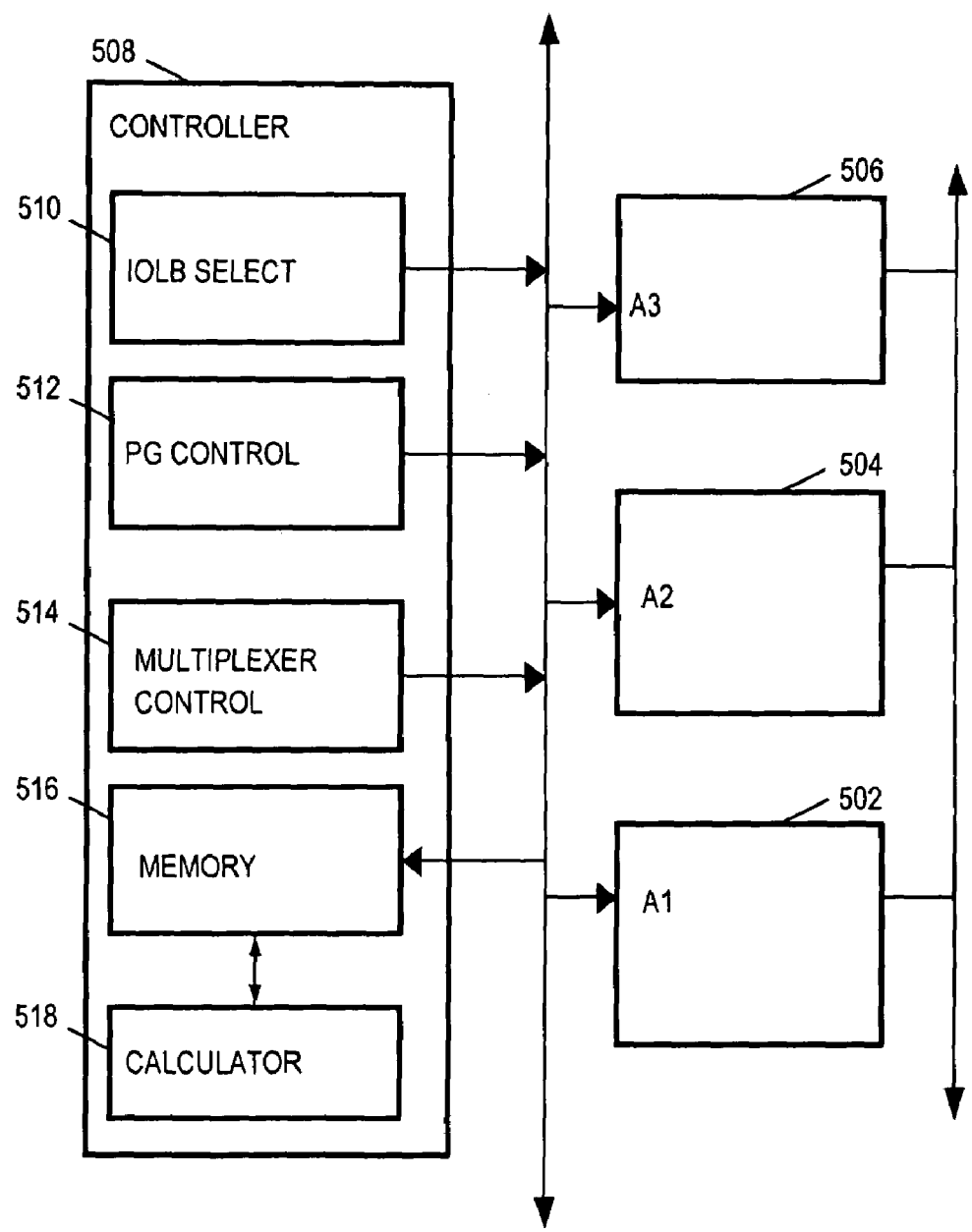
FIG. 5A depicts an embodiment for control of time of flight measurements.

FIG. 5A shows a functional block diagram implementing the methods described herein. A plurality of agents 502, 504, and 506 are connected to a controller 508 by individual lines and/or a control bus. Controller 508 performs a variety of functions and selectively controls the relevant components within each agent as will now be described. An IOLB select function 510 is adapted to select each agent individually and to select any two at a time. In one embodiment, when a single agent is selected, the internal input and output delay times of the selected agent is determined, and when two at a time are selected, the time delay of the path between them is computed. Thus, IOLB select function 510 selects one or two agents. The internal input and output delay times of a plurality of IOLB circuits may first be determined before determining the time of flight between any two of them.

Controller 508 comprises a pattern generator controller 512. Pattern generator controller 512 is adapted to control the patterns generated by the pattern generators of the agents. Pattern generator (PG) controller 512 can control each pattern generator individually one at a time and can control two pattern generators at a time. Thus, in a first sequence of measurements, PG controller 512 will cause a pattern generator of agent one to produce a pattern that is used to determine Tloop=Tco+Tsu. Then, PG controller will develop a DCLK signal pattern that is used to determine Tsu. These control signals can be sequentially sent to each agent until Tco and Tsu is known for each agent.

In a second sequence of measurements, PG controller 512 issues control signals to the pattern generators of two different agents for the measurement of the total delay time from a first internal point of the first agent to a second internal point of the second agent. Clearly, to perform this measurement, the patterns generated by the pattern generators of the first and second agent must be the same. Further, they must be synchronized. In one embodiment, therefore, the pattern generators of two different agents are synchronized by a common data clock. The control signals from PG controller 512 accomplish these functions.

Controller 508 comprises a multiplexer controller 514 to control the path of signals within the IOLB circuit of an agent to effectuate the measurements described herein. Thus, to measure Tloop of an agent, multiplexer controller 514 sets multiplexer 101 of the agent to output the signal received from pattern generator 204, and multiplexer controller 514 also sets multiplexer 112 of the agent to output the signal received from I/O pad 110. To measure Tsu, multiplexer controller 514 sets multiplexer 112 to output the DCLK received at an input. To measure total delay time, which includes time of flight between the pads of two agents, multiplexer controller 514 sets multiplexer 101 of the transmitting agent to output the signal received from pattern generator 204, and multiplexer controller 514 sets the multiplexer 112 of the receiving agent to output the signal received on the I/O pad of the receiving agent.

Controller 508 also comprises memory 516 for storage of measurements and calculated data. A calculator 518 enables controller 508 to perform the calculations described above. Data passes between a register of calculator 518 and memory 516. Data also passes from the plurality of agents to memory 516. Measurement values are thus transferred from an agent to controller 508 and stored in memory 516 there within.

For example, when the I/O loop within an agent is measured to yield Tloop, this value is transferred to controller 508 and stored in memory 516. Then, when Tsu is measured, this value is also transferred to controller 508 and stored in memory 516. Calculator 518 receives Tsu and Tloop from memory 516 to calculate Tco. Tco is then stored in memory 516. Similarly, when an agent measures the total delay time, Ttotal, controller 508 receives the measurement value of Ttotal and stores this value in memory 516. Calculator 518 receives Ttotal, $Tsu_{agent\_2}$, and $Tco_{agent\_1}$ to compute the time of flight of the signal between the input/output pads of agents 1 and 2.

Figure 6:
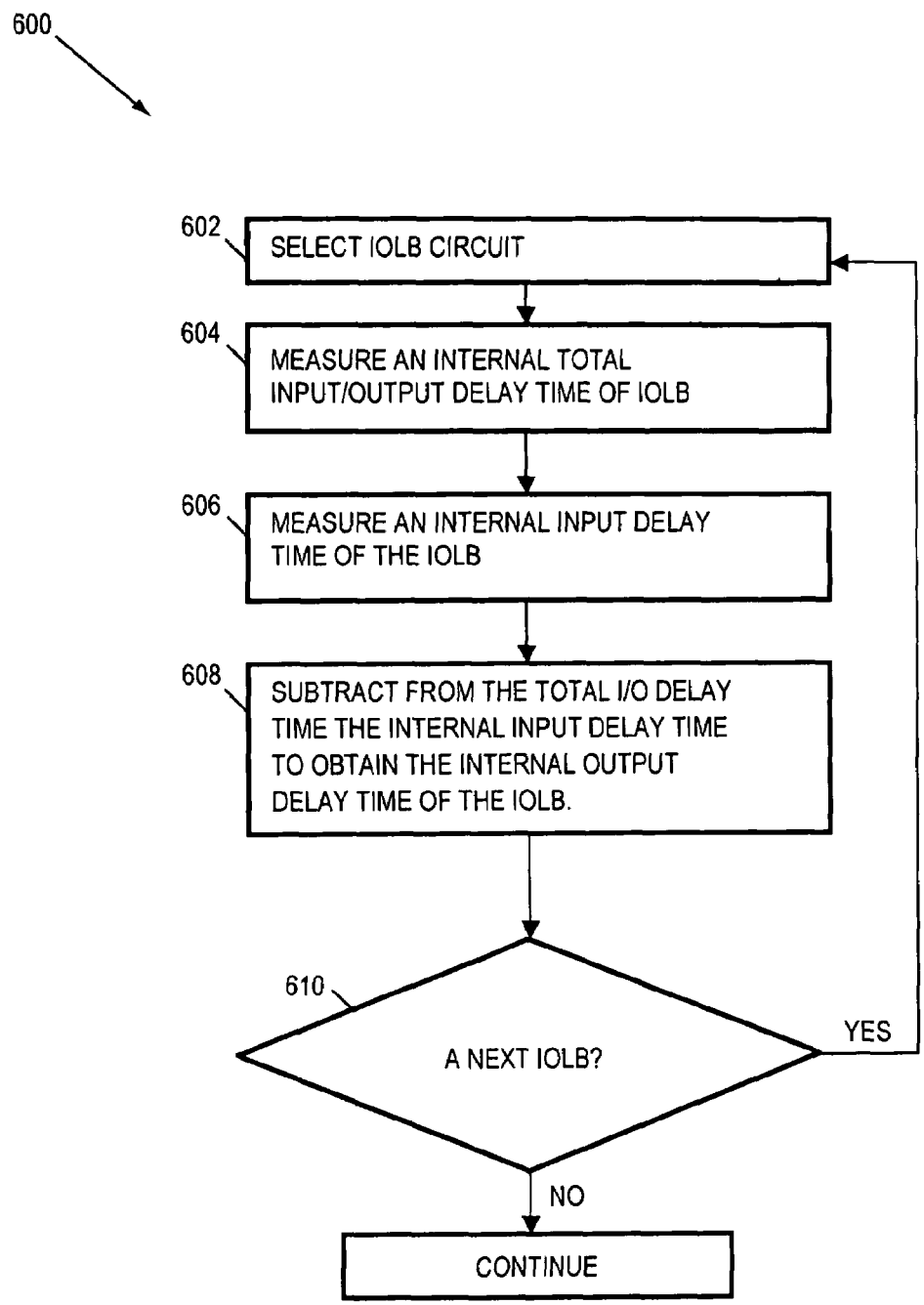
FIG. 6 depicts a flow chart for determining internal delay times of IOLB circuits.

FIG. 6 shows a flow chart 600 of an embodiment for making measurements preliminary to a determination of times of flight between multiple agents for a collection of connected agents. A first IOLB is selected to determine its internal input and output delay times (element 602). The system measures an internal Input/Output (I/O) delay time of the IOLB (element 604). This is the delay time of the internal loop that combines the output path and the input path, so that the measured signal passes from pattern generator 204, through multiplexers 101 and 112, to comparator 206, as described in detail above with reference to FIG. 2. The total time delay of this path is Tloop=Tco+Tsu, (Tclock_to_pad+Tset_up).

The system also measures the internal input delay time of the IOLB (element 606). This is Tsu, the time of the path of DCLK through multiplexer 112 to comparator 206, as described in detail above with reference to FIG. 3. Then, the system obtains the internal output delay time, Tco, by subtracting from the measured internal total 10 time the measured internal input delay time (element 608). If there is another connected IOLB that has not yet been exercised to determine its internal input and output delay times (element 610), the system loops back to select a next IOLB (element 602). Otherwise, the system continues onward to perform the steps of FIG. 7.

Figure 7:
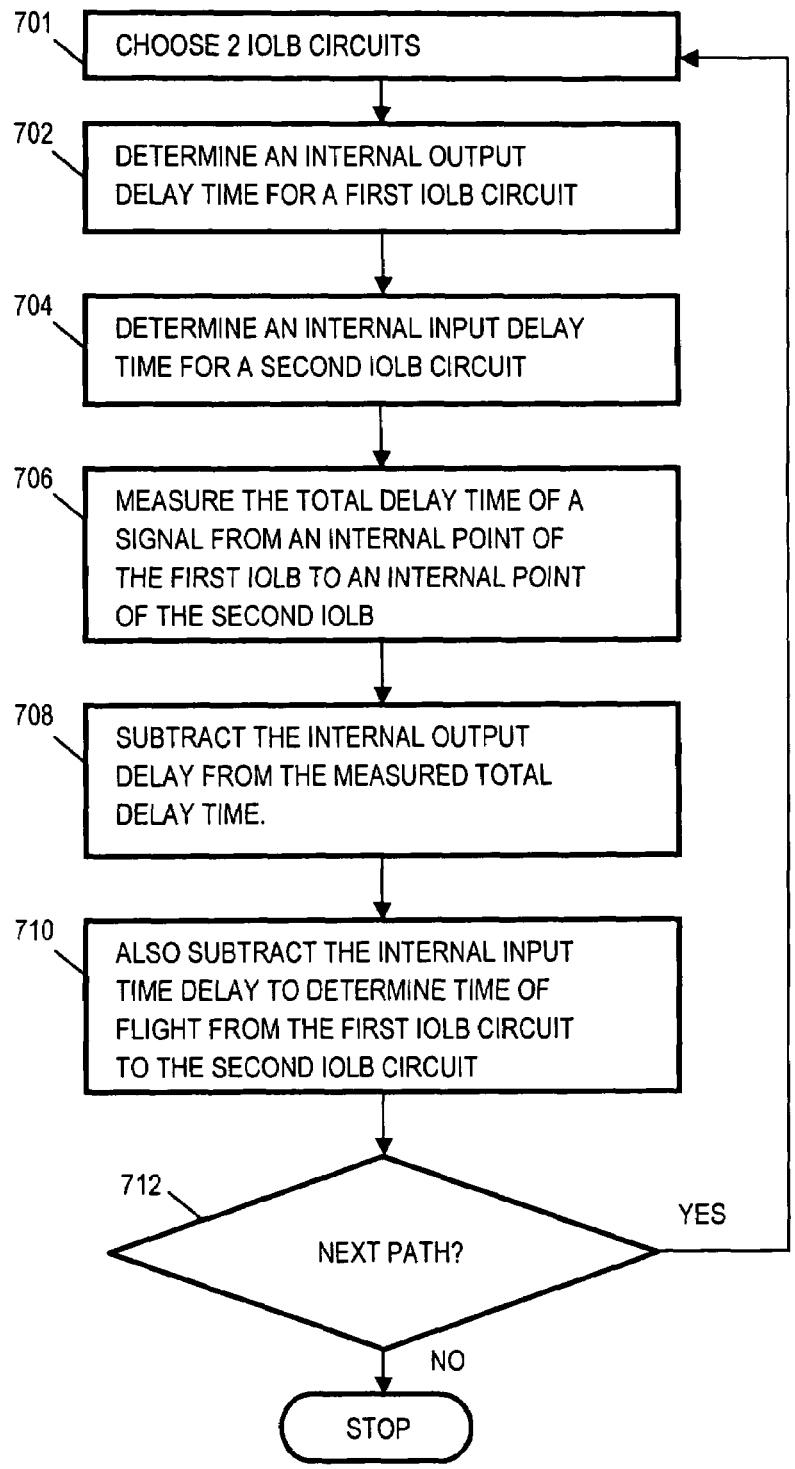
FIG. 7 depicts a flow chart for determining time of flight between IOLB circuits.

FIG. 7 shows a flow chart 700 of an embodiment for determining propagation delays on conducting lines connecting a plurality of IOLB circuits. Consider the process of determining the time of flight between a first IOLB circuit and a second IOLB circuit. First, the delay time of the first IOLB circuit (element 702). The internal output delay time is the time for the signal to propagate from a first internal point in the IOLB circuit along an output path to the described with reference to FIG. 6. The system also determines the internal input delay time of the second IOLB circuit (element 704). The internal input delay time is the time for the signal to propagate from the I/O pad of the IOLB circuit to a second internal point in the circuit along an input path. This is also done according to the process of FIG. 6.

Next, the system measures the total delay time of a test signal from the first internal point of the first IOLB circuit to the second internal point of the second IOLB circuit (element 706). This is the path shown in FIG. 5, for example, that includes a first agent 402 and a second agent 404 or 403. This path includes the internal output delay time of the first agent, and the time of flight from the I/O pad of the first agent to the I/O pad of the second agent, and the internal input delay time of the second agent.

The system may now calculate the time of flight using these measurements. To determine the time of flight, the system subtracts from the measured total delay time the internal output delay time of the first agent (element 708) and the internal input delay time of the second agent (element 710). Once the system determines the time of flight between a first agent and a second agent, the system may compute the time of flight of a next path (element 712) by selecting two more IOLB circuits (element 701). When all the paths have been computed, the process may stop (element 712). Thus, by a series of measurements and calculations, the time of flight between I/O pads of different IOLB circuits can be determined with high very accuracy in a simple and non-intrusive way.

Thus, embodiments include a method for determining the time of flight from the determining an internal output delay time of the first IOLB circuit, wherein the internal output delay time is the delay time from a first point internal to the first IOLB circuit to the output pad of the first IOLB circuit. The method also comprises determining an internal input delay time of the second IOLB circuit; wherein the internal input delay time is the delay time from the I/O pad of the second IOLB circuit to a second point that is internal to the second IOLB circuit. The method comprises measuring a total delay time between the first point internal to the first IOLB circuit to the second point internal to the second IOLB circuit; and subtracting from the measured total delay time the internal output delay time and the internal input delay time to determine a time of flight between the I/O pads of the first and second IOLB circuits.

The described embodiments provide a desirable measurement method that is electronic, very accurate, easily implemented, repeatable, and non-intrusive. Moreover, embodiments require only minimal modification of existing circuitry, namely by inserting a multiplexer between the I/O pad of the IOLB circuit and the input driver of the IOLB circuit.

The present invention and some of its advantages have been described in detail for some embodiments. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A test system for measuring times of flight between Input/Output (IO) Loopback (IOLB) circuits, comprising
a plurality of IOLB circuits, each with a mechanism within the IOLB circuit to determine an input delay time and an output delay time of the IOLB circuit; and
a controller to select two of the plurality of IOLB circuits and to determine a time of flight there between by measuring a total delay time and subtracting both an output delay time of a first of the two IOLB circuits and an input delay time of the second IOLB circuit.

2. The system of claim 1, further comprising a multiplexer controller to set up for each of one or more IOLB circuits, a first internal test path comprising both an internal output path and an internal input path, and a second internal test path comprising the internal input path.

3. The system of claim 2, wherein an IOLB circuit comprises a multiplexer to receive at one input a signal from the I/O pad of the IOLB circuit and to receive at another input a test signal.

4. The system of claim 3, wherein an IOLB circuit further comprises a second multiplexer to select between a test signal and data from a data source.

5. The system of claim 2, further comprising a calculator to subtract a measured signal propagation time along the second internal test path from a measured signal propagation time along the first internal test path.

6. The System of claim 1, further comprising a multiplexer within an IOLB circuit to receive at one input a signal from the I/O pad of the IOLB circuit and to receive at another input a test signal.

7. The system of claim 6, wherein an IOLB circuit further comprises a second multiplexer to select between a test signal and data from a data source.

8. The system of claim 1, wherein an IOLB circuit comprises an output path from a first internal point of the IOLB circuit to an I/O pad of the IOLB circuit.

9. The system of claim 1, further comprising a pattern generator within an IOLB circuit to generate a first test signal to be propagated through an output path to an I/O pad of the IOLB circuit.

10. The system of claim 9, further comprising a comparator within the IOLB circuit to receive at a first of its inputs one of the first and second test signals and to receive at a second of its inputs a reference signal from the pattern generator, wherein the comparator within the IOLB circuit determines a first propagation time of the first test signal along the output path and the input path, and determines a second propagation time of the second test signal along the input path.

11. The system of claim 1, further comprising a multiplexer within an IOLB circuit in an input path to select as an output one of a plurality of inputs, one input receiving a signal from an I/O pad of the IOLB circuit, and another input receiving a second test signal.

12. The system of claim 1, further comprising an input path from an input of the multiplexer to a second internal point of the IOLB circuit.

* * * * *